(12) United States Patent
Liu et al.

(10) Patent No.: US 7,144,773 B1
(45) Date of Patent: Dec. 5, 2006

(54) METHOD FOR PREVENTING TRENCHING IN FABRICATING SPLIT GATE FLASH DEVICES

(75) Inventors: Shih-Chang Liu, Allan Township, Kaohsiung County (TW); Chi-Hsin Lo, Zhubei (TW); Gwo-Yuh Shiau, Hsinchu (TW); Chia-Shiung Tsai, Hsin-Chu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 11/141,902

(22) Filed: Jun. 1, 2005

(51) Int. Cl.
*H04L 21/336* (2006.01)
*H04L 21/8242* (2006.01)
*H04L 29/788* (2006.01)
*H04L 29/76* (2006.01)

(52) U.S. Cl. ............ 438/257; 438/258; 438/259; 438/255; 438/264; 438/266; 438/267; 438/424; 257/315; 257/319; 257/E21.177

(58) Field of Classification Search ........ 438/257–259, 438/255, 264, 266–267; 257/315, 319
See application file for complete search history.

(56) References Cited

U.S. PATENT DOCUMENTS

2003/0124800 A1* 7/2003 Park et al. ............... 438/257
2003/0203571 A1* 10/2003 Rabkin et al. ........... 438/257
2004/0241942 A1* 12/2004 Hsieh ...................... 438/257

* cited by examiner

*Primary Examiner*—Michael Lebentritt
*Assistant Examiner*—Mohsen Ahmadi
(74) *Attorney, Agent, or Firm*—Thomas, Kayden, Horstemeyer & Risley

(57) ABSTRACT

A method for forming a split gate flash device is provided. In one embodiment, a semiconductor substrate with a dielectric layer formed thereover is provided. A conductor layer is formed overlying the dielectric layer. A masking layer is deposited overlying the conductor layer. A light sensitive layer is formed overlying the masking layer. The light sensitive layer is patterned and etched to form a pattern of openings therein. The masking layer and the conductor layer are etched according to the pattern of openings in the light sensitive layer. The conductor layer is etched at the outer surface area between the conductor layer and the dielectric layer to form undercuts. The dielectric layer is etched to form a notch profile at the outer surface area between the conductor layer and the dielectric layer and portions of the substrate are etched to form a plurality of trenches. An isolation layer is filled over the plurality of trenches and the masking layer. The masking layer and portions of the conductor layer and isolation layer are etched away, wherein a portion of the isolation layer is preserved in the notch profile.

14 Claims, 9 Drawing Sheets

METHOD FOR PREVENTING TRENCHING IN FABRICATING SPLIT GATE FLASH DEVICES

BACKGROUND

The present invention relates to semiconductor memory devices, and, more particularly, to a structure and method of preventing trenching in the fabrication of self-aligned split gate flash devices.

A split gate flash memory device is essentially a MOS transistor with a variable threshold voltage. The threshold voltage varies with the amount of charge that is stored on a floating gate structure. The floating gate structure overlies a first part of the device channel region. A control gate structure overlies a second part of the device channel region. Voltage on the control gate controls the second part of the device channel region directly and controls the first part of the device channel indirectly, as modulated by charge on the floating gate. The control gate is formed in close proximity to the floating gate so that a capacitive coupling between the control gate and the floating gate is achieved.

Flash memories have undergone significant improvements over the years, such as dramatic reduction of device size. As devices reduce in size, however, a number of problems may occur. One such problem is the formation of trenches in the active areas of the devices during a floating gate polysilicon etching step. This problem is best explained by way of description and illustration. FIGS. 1–10 show the present state of manufacturing a partially completed split gate flash device. Referring to FIG. 1, a top view of a partially completed split gate flash memory is shown. A typical flash memory comprises a very large number, perhaps millions, of identical memory cells. The cells are arranged in a two-dimensional array to facilitate addressing, reading, and writing to specific cells in the array.

In this layout, a semiconductor substrate 10 is provided. The substrate 10 is divided into two types of areas: active 10 and isolation 20. The active areas (OD) 10 are simply areas of semiconductor. The isolation areas (STI) 20 are areas where a dielectric material has been formed. The isolation areas 20 may comprise any type of dielectric material and structure suitable for isolating adjacent active devices, such as shallow trench isolation (STI) that may be formed by well-known methods. Typically, STI regions 20 comprise trenches in the substrate 10 that are filled with a dielectric material such as silicon oxide. The memory array is laid out such that the STI regions 20 and active (OD) regions 10 (active region 10 is not shown but a first patterned masking layer of silicon nitride (SiN) 50 overlying active region 10 is shown instead) are in parallel. Two cross sections "2" and "9" are analyzed in the description below. The "2" cross section bisects the parallel STI 20 and SiN 50 regions. The "9" cross section is parallel to the STI 20 and SiN regions 50.

Referring now to FIG. 2, the "2" cross section is illustrated and several layers are formed overlying the substrate 10. A dielectric layer 30 is formed overlying the substrate 10. This dielectric layer 30 is the floating gate dielectric and may comprise any dielectric layer having suitable dielectric constant and breakdown capability.

A conductor layer 40 is then grown overlying the dielectric layer 30. The conductive layer may comprise any conductive material, such as a metal, a semiconductor, or a combination of both, that can be used in the formation of a MOS gate. A first masking layer 50 is then deposited overlying the conductor layer 40. A photoresist layer (not shown) is then deposited over the masking layer 50 and using a conventional photolithography process, the photoresist layer is patterned and etched to form a pattern of openings. The photoresist pattern is normally used to protect all areas on which active devices will later be formed. Thereafter, the masking layer 50, conductor layer 40, dielectric layer 30 and substrate 10 are etched according to the pattern of openings in the photoresist layer and a plurality of isolation trenches defined by masking layer 50 are formed in the substrate 10. The masking layer 50 and conductor layer 40 may be dry etched, and the dielectric layer 30 may be etched by means of either a dry- or wet-chemical process, as is well-known in the art. The etching is further carried into the substrate 10 to form trenches. The trenches are thereafter filled by an STI oxide material and may be filled by well-known methods such as high density plasma CVD (HDPCVD). The STI oxide material is thereafter planarized by conventional CMP (chemical mechanical planarization) processes. Other planarization processes could also be used. As shown in FIG. 2, the substrate 10 is divided by a series of isolation (STI) regions 20, each isolation region separates an active cell area in the substrate.

FIG. 3 is a first cross sectional view of the structure of FIG. 2 showing the removal of the first masking layer 50 by conventional etching processes and the deposition of a second masking layer 60. Second masking layer 60 is the floating gate layer and may comprise of a material that can be selectively etched with respect to the underlying layers such as conductor layer 40. Second masking layer 60 may comprise silicon nitride that is deposited by chemical vapor deposition.

FIG. 4 is a second cross sectional view using the "9" of FIG. 1 of the split gate flash device showing a patterned photoresist layer 70, second masking layer 60, conductor layer 40, and the dielectric layer 30 formed over the substrate 10. After a conventional lithography process, FIG. 5 shows the second masking layer 60 etched and a portion of conductor layer 40 etched away and the removal of the patterned photoresist layer 70 by a conventional ashing process. Following the ashing step, an oxide material, such as TEOS 80, is deposited over second masking layer 60 and conductor layer 40 for subsequent spacer formation, as shown in FIG. 6. TEOS layer 80 is etched back to form spacers 90 on the sidewalls of the second masking layer 60, as shown in FIG. 7. This etch back step preferably comprises a dry etch having an anisotropic etching characteristic. FIG. 8 is a cross sectional view taken from "2" of FIG. 1 of the structure of FIG. 3 after the step of forming spacers showing corners of active regions (OD) 10 being exposed.

FIG. 9 is a cross sectional view taken from "9" of FIG. 1 of the structure of FIG. 7 showing the etching of the conductor layer 40 and partial etching of the dielectric layer 30. Conductor layer 40 is etched through where exposed by the second masking layer 60 and spacers 90.

The problem the present invention addresses is during the conventional formation of split gate flash devices where undesirable trenches are formed in the active areas of the devices during the floating gate polysilicon/conductor layer etching step. FIG. 10 is a cross sectional view taken from "2" of FIG. 1 of the structure of FIG. 8 after the etching of the conductor layer 40 and the formation of undesirable trenches 100 in the substrate. As shown in FIG. 8, STI regions 20 recesses after the floating gate TEOS spacer etching step which causes the corners of active regions (OD) 10 to become exposed. The exposed active regions 10 causes trenching after the etching of conductor layer 40. Trenches 100 affect product yield and performance of the split gate flash device.

Accordingly, what is needed in the art is a device and method of manufacture thereof that addresses the above-discussed issues.

SUMMARY

The present invention relates to a method for forming a split gate flash device. In one embodiment, a semiconductor substrate with a dielectric layer formed thereover is provided. A conductor layer is formed overlying the dielectric layer. A masking layer is deposited overlying the conductor layer. A light sensitive layer is formed overlying the masking layer. The light sensitive layer is patterned and etched to form a pattern of openings therein. The masking layer and the conductor layer are etched according to the pattern of openings in the light sensitive layer. The conductor layer is etched at the outer surface area between the conductor layer and the dielectric layer to form undercuts. The dielectric layer is etched to form a notch profile at the outer surface area between the conductor layer and the dielectric layer and portions of the substrate are etched to form a plurality of trenches. An isolation layer is filled over the plurality of trenches and the masking layer. The masking layer and portions of the conductor layer and isolation layer are etched away, wherein a portion of the isolation layer is preserved in the notch profile.

BRIEF DESCRIPTION OF THE DRAWINGS

The features, aspects, and advantages of the present invention will become more fully apparent from the following detailed description, appended claims, and accompanying drawings in which:

DETAILED DESCRIPTION

In the following description, numerous specific details are set forth to provide a thorough understanding of the present invention. However, one having an ordinary skill in the art will recognize that the invention can be practiced without these specific details. In some instances, well-known structures and processes have not been described in detail to avoid unnecessarily obscuring the present invention.

Reference will now be made in detail to the present preferred embodiments of the present invention, examples of which are illustrated in the accompanying drawings.

Figure 1:
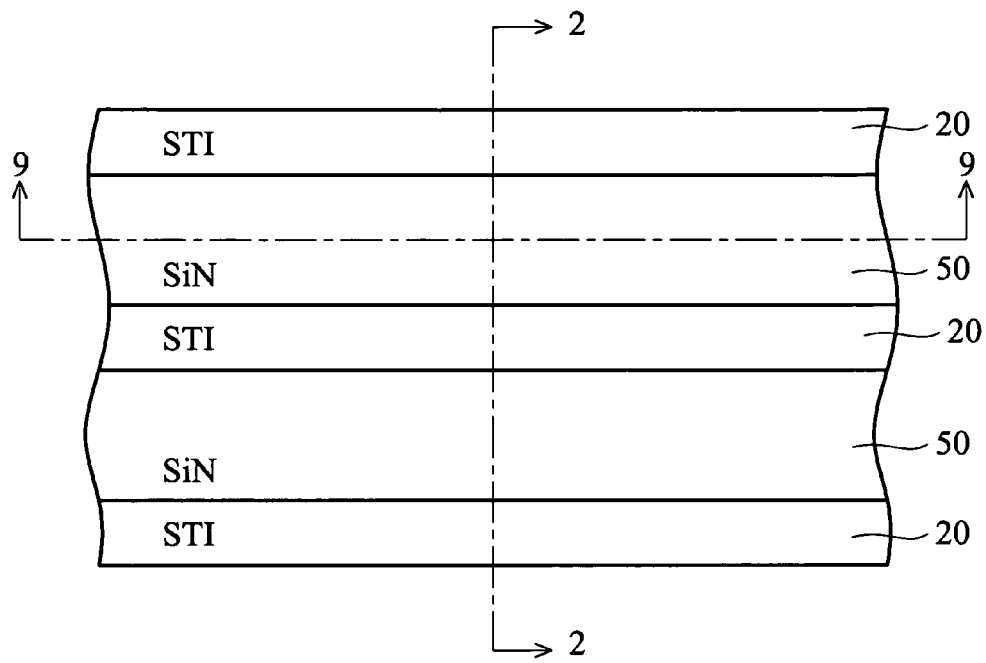
FIG. 1 is a top layout view of a partially completed split gate flash device.
Figure 2:
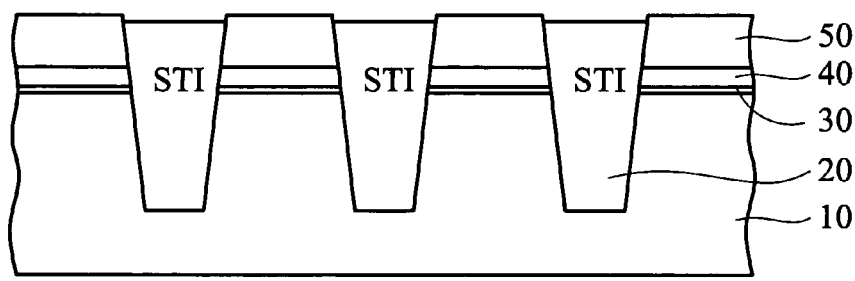
FIG. 2 is a cross sectional view taken from "2" of FIG. 1 of the split gate flash device showing a patterned first masking layer, patterned conductor layer, and patterned dielectric layer formed over a semiconductor substrate and a plurality of isolation regions.
Figure 11:
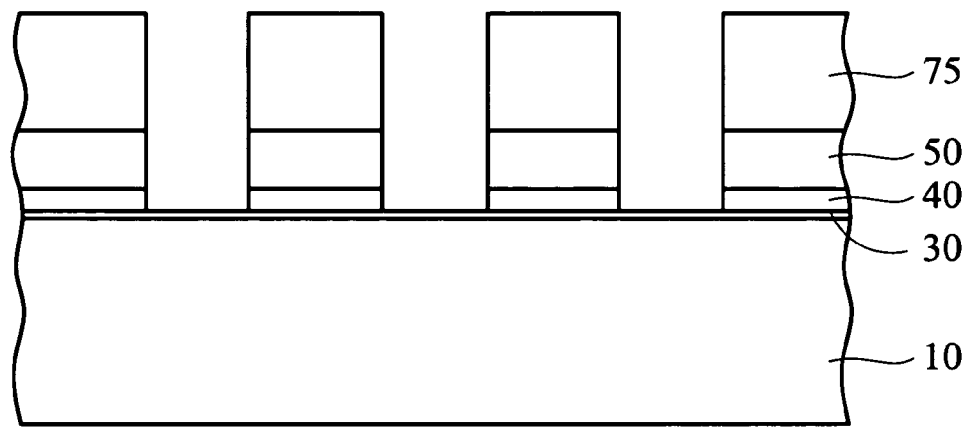
FIG. 11 is a cross sectional view taken from "2" of FIG. 1 prior to the formation of trenches and the deposition of an oxide layer in isolation region 20 according to one embodiment of the present invention.

FIG. 11 is a cross sectional view taken from "2" of FIG. 1 showing a partially completed split gate flash device prior to the formation of trenches and the deposition of an oxide layer in isolation regions 20 according to one embodiment of the present invention. Several layers are formed overlying a semiconductor substrate 10. Substrate 10 may comprise any suitable semiconductor material or combinations of materials. In one embodiment, substrate 10 comprises monocrystalline silicon. Other substrates, such as silicon on isolation (SOI), could also be used. A dielectric layer 30 is formed overlying the substrate 10. This dielectric layer 30 is the floating gate dielectric and may comprise any dielectric layer having suitable dielectric constant and breakdown capability. Preferably, the dielectric layer 30 comprises an oxide material. More preferably, the dielectric layer comprises silicon oxide that is thermally grown on the substrate 10 to a thickness of between about 40 Angstroms to about 150 Angstroms.

A conductor layer 40 is then grown overlying the dielectric layer 30. The conductive layer may comprise any conductive material, such as a metal, a semiconductor, or a combination of both, that can be used in the formation of a MOS gate. Preferably, the conductor layer 40 comprises a polysilicon layer that is deposited overlying the dielectric layer 30. The polysilicon layer 40 may be doped or undoped. More preferably, the polysilicon layer 40 is formed by chemical vapor deposition of polysilicon to a thickness of between about 300 Angstroms to about 1500 Angstroms.

A first masking layer 50 is then deposited overlying the conductor layer 40. First masking layer 50 serves to protect active regions 10 during the STI oxide deposition process and serves as a polish stop layer during the chemical mechanical planarization (CMP) step The first masking layer 50 preferably comprises a material that can be selectively etched with respect to the conductor layer 40. More preferably, the masking layer 50 comprises silicon nitride (SiN) that is deposited by a chemical vapor deposition process and preferably deposited to a thickness of between about 500 Angstroms to about 2000 Angstroms.

A photoresist layer 75 is then deposited over the masking layer 50 and using a conventional photolithography process, the photoresist layer is patterned and etched to form a pattern of openings. The photoresist pattern is normally used to protect all areas on which active devices will later be formed. Thereafter, the masking layer 50 and the conductor layer 40 are etched according to the pattern of openings in the photoresist layer 75, the masking layer 50 and the conductor layer 40 may be etched by a dry etching process.

Figure 12:
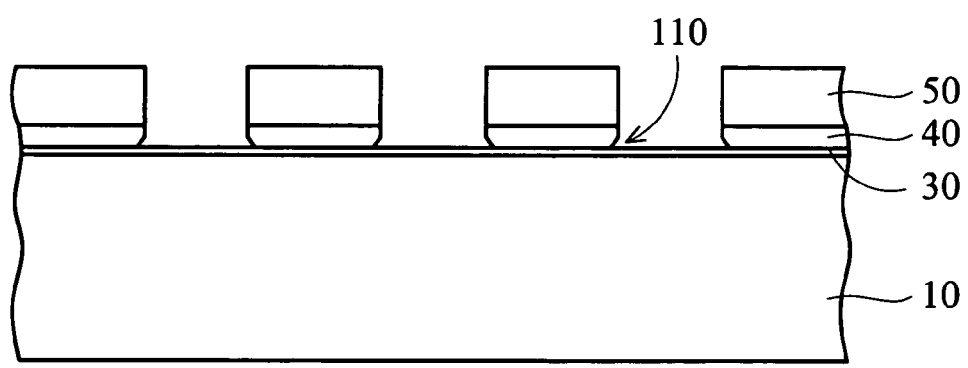
FIG. 12 is a cross sectional view of the structure of FIG. 11 after the patterned photo resist layer has been removed and the etching of the conductor layer to form undercuts according to one embodiment of the present invention.

FIG. 12 is a cross sectional view of the structure of FIG. 11 after the patterned photoresist layer 75 has been removed and the etching of the conductor layer 40 to form undercuts 110 according to one embodiment of the present invention. Patterned photoresist layer 75 may be removed by oxygen plasma ashing. Undercuts 110 may be formed by a dry etch procedure where the conductor layer 40 is etched at the outer surface area between the conductor layer 40 and the dielectric layer 30. In one embodiment, undercuts 110 may be formed by a procedure of scattering chlorine ions having a gas of chlorine, at about 100 to about 200 sccm, with a temperature of about 35° C. to about 95° C., a pressure of about 10 mTorr to about 50 mTorr, and with a time of about 5 to 30 seconds.

Figure 13:
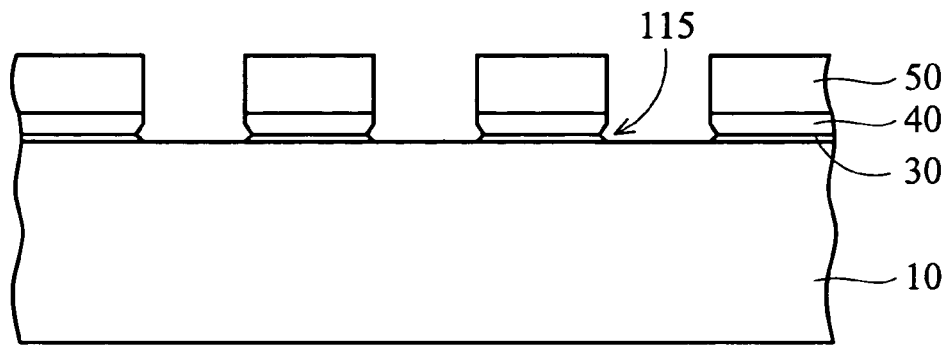
FIG. 13 is a cross sectional view of the structure of FIG. 12 after a portion of the dielectric layer has been etched away to form a notch profile at the outer surface area between the conductor layer and the dielectric layer according to one embodiment of the present invention.

FIG. 13 is a cross sectional view of the structure of FIG. 12 after a portion of the dielectric layer 30 has been etched away to form a notch profile 115 at the outer surface area between the conductor layer and the dielectric layer according to one embodiment of the present invention. A portion of dielectric layer 30 may be removed by using either a dry- or wet-etch chemical process, as is well known to those skilled in the art. In one embodiment, notch profile 115 may be formed by a break through etching gas comprising tetra fluorides methane (CF4), having a pressure of about 5 mTorr to about 30 mTorr, with a temperature of about 35° C. to about 95° C., and with a time of about 5 to about 30 seconds.

Figure 14:
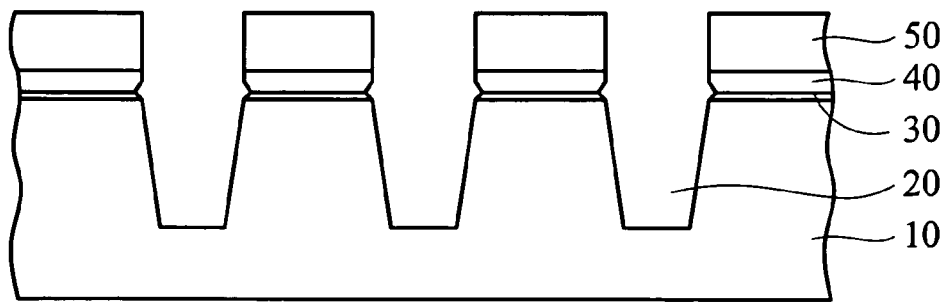
FIG. 14 is a cross sectional view of the structure of FIG. 13 showing the formation of trenches defined by the masking layer according to one embodiment of the present invention.

The etching is further carried into the substrate 10 to form trenches. FIG. 14 is a cross sectional view of the structure of FIG. 13 showing the formation of trenches 20 defined by the masking layer according to one embodiment of the present invention. Trenches 20 are formed by conventional STI trench etch processes. In one embodiment, the trenches 20 are etched by dry plasma etching processes.

Figure 15:
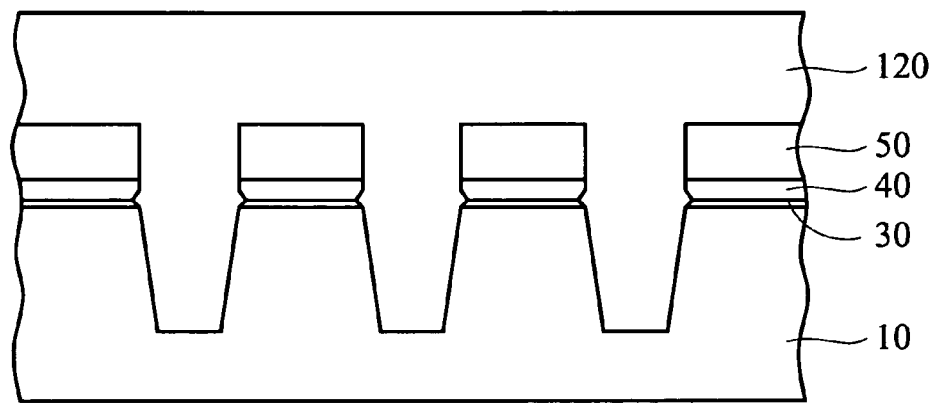
FIG. 15 is a cross sectional view of the structure of FIG. 14 showing the deposition of an isolation layer over the trenches and the masking layer according to one embodiment of the present invention.
Figure 16:
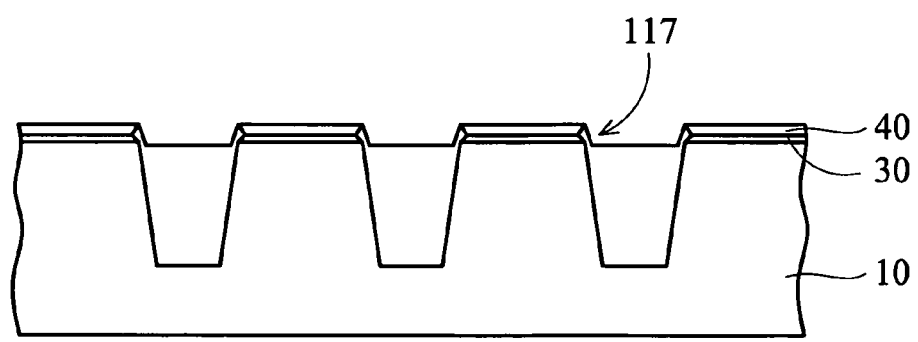
FIG. 16 is a cross sectional view of the structure of FIG. 15 showing the removal of the masking layer and portions of the conductor layer following the floating gate TEOS spacer etching step and the planarization of the isolation layer according to one embodiment of the present invention.

FIG. 15 is a cross sectional view of the structure of FIG. 14 showing the deposition of an isolation layer in the trenches and over the masking layer according to one embodiment of the present invention. Isolation layer 120 may comprise a dielectric material such as silicon dioxide that may be deposited in the trenches 20 and over the masking layer 50 by well-know deposition methods, thus forming shallow trench isolation (STI) as shown in FIG. 16. In one embodiment, the deposition is performed by plasma enhanced chemical vapor deposition (PECVD). In a preferred embodiment, the deposition is performed by high-density plasma CVD (HDPCVD) because of its low deposition temperature, relatively planar surface, and excellent gap-fill characteristics.

Figure 3:
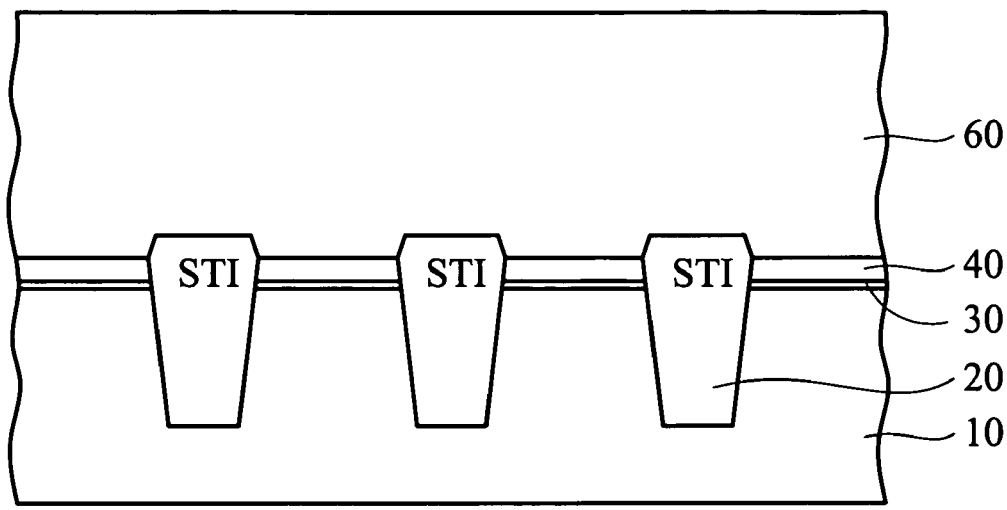
FIG. 3 is a cross sectional view of the structure of FIG. 2 showing the removal of the first masking layer and the deposition of a second masking layer.
Figure 4:
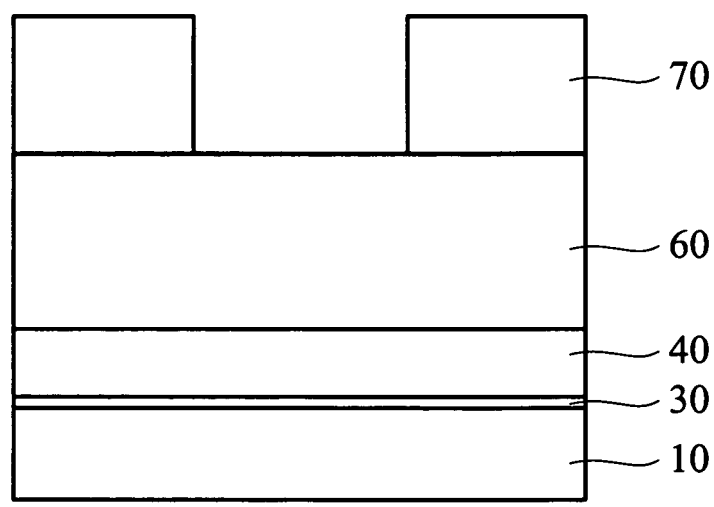
FIG. 4 is a cross sectional view taken from "9" of FIG. 1 of the split gate flash device showing a patterned photoresist layer, second masking layer, conductor layer, and the dielectric layer formed over the substrate.
Figure 5:
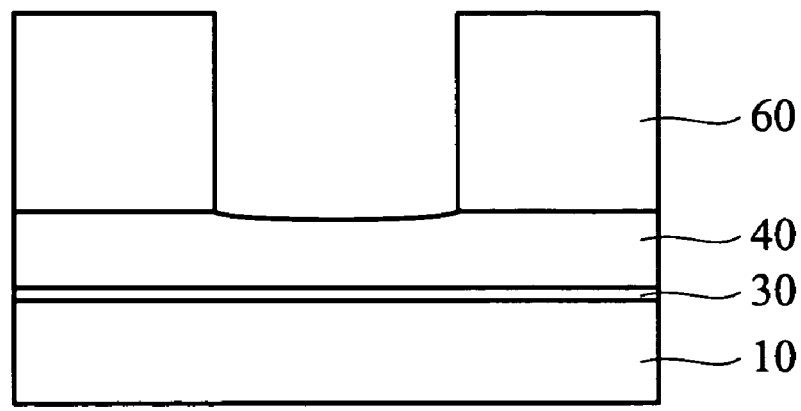
FIG. 5 is a cross sectional view of the structure of FIG. 4 showing the etching of the second masking layer and the removal of the patterned photoresist layer.
Figure 6:
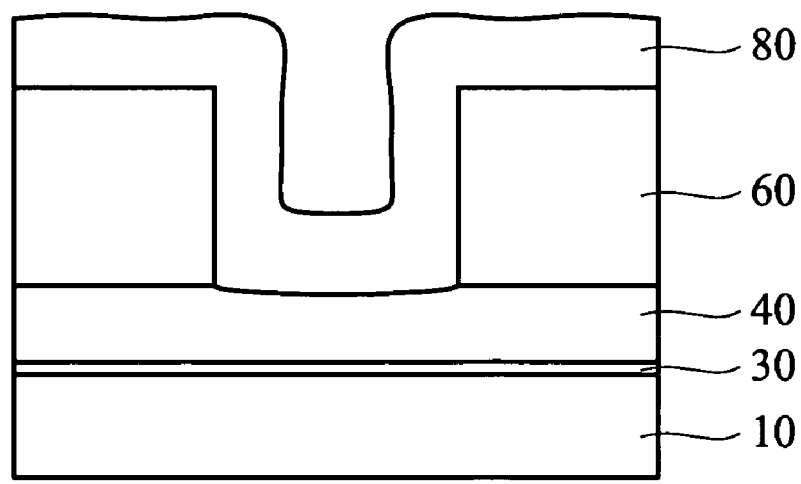
FIG. 6 is a cross sectional view of the structure of FIG. 5 showing the deposition of a TEOS layer for subsequent spacer formation.
Figure 7:
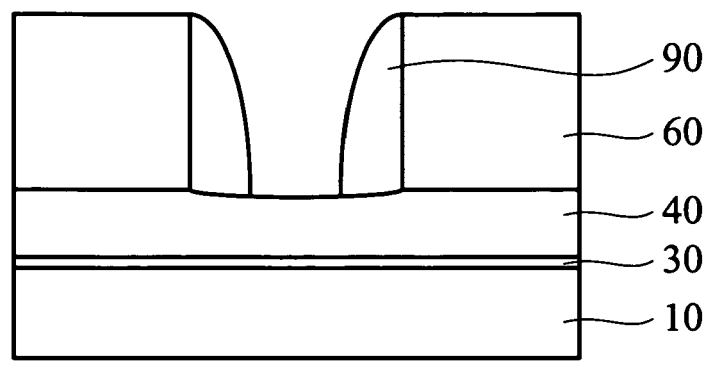
FIG. 7 is a cross sectional view of the structure of FIG. 6 showing the formation of spacers.
Figure 8:
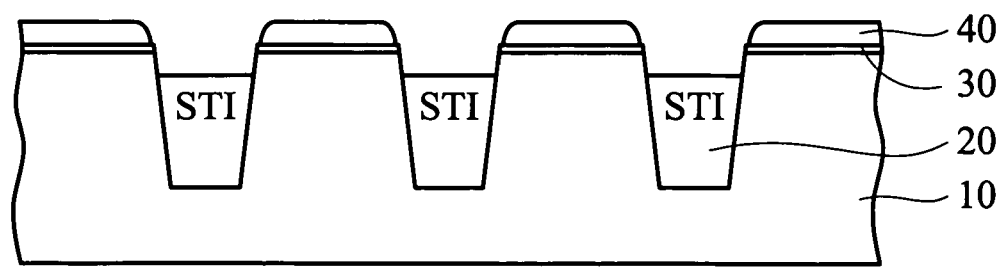
FIG. 8 is a cross sectional view taken from "2" of FIG. 1 of the structure of FIG. 3 after the step of forming spacers.
Figure 9:
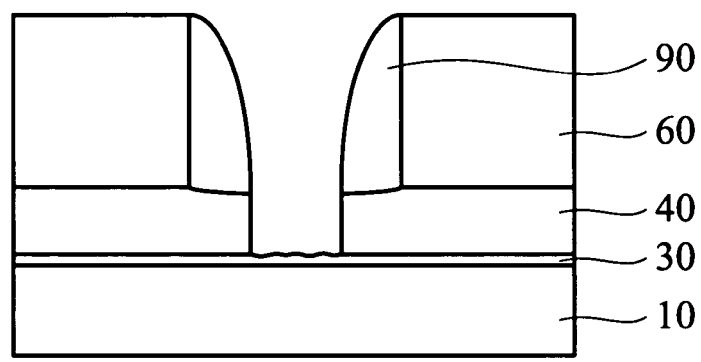
FIG. 9 is a cross sectional view taken from "9" of FIG. 1 of the structure of FIG. 7 showing the etching of the conductor layer.
Figure 10:
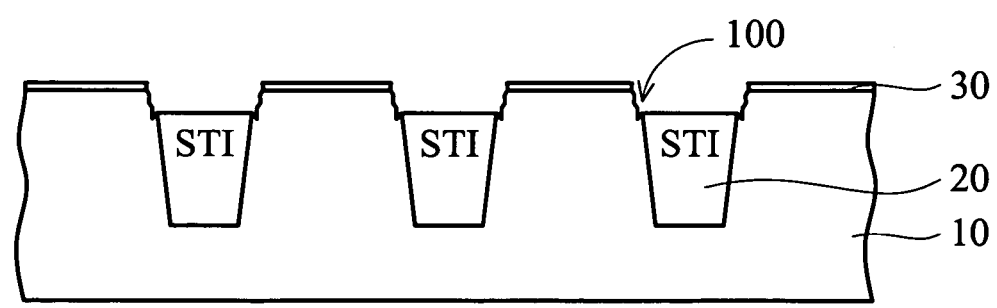
FIG. 10 is a cross sectional view taken from "2" of FIG. 1 of the structure of FIG. 8 after the step of etching the conductor layer and the formation of trenches in the substrate.

FIG. 16 is a cross sectional view of the structure of FIG. 15 showing the removal of the masking layer and portions of the conductor layer after a floating gate TEOS spacer etching step and the planarization of the isolation layer 120 according to one embodiment of the present invention. The isolation layer 120 may be planarized to attain a substantially flat surface by chemical mechanical planarization (CMP). Following TEOS spacer etching step, where the masking layer 50 and portions of the conductor layer 40 are removed, a portion 117 of the isolation layer 120 is preserved in the notch profile 115. The removal of the masking layer 50 can be accomplished in a high density plasma (HDP) etcher. Referring back to FIG. 8, a cross sectional view taken from "2" of FIG. 1 shows the structure of FIG. 3 after the step of forming spacers. STI regions 20 recesses after the floating gate TEOS spacer etching step which causes the corners of active regions (OD) 10 to become exposed. The exposed active regions 10 causes trenching as was shown in FIG. 10 after the etching of conductor layer 40. The portion 117 of isolation layer 120 protects the corners of the active region (OD) 10, thereby preventing the formation of undesirable trenches in the active areas of the split gate flash device.

Figure 17:
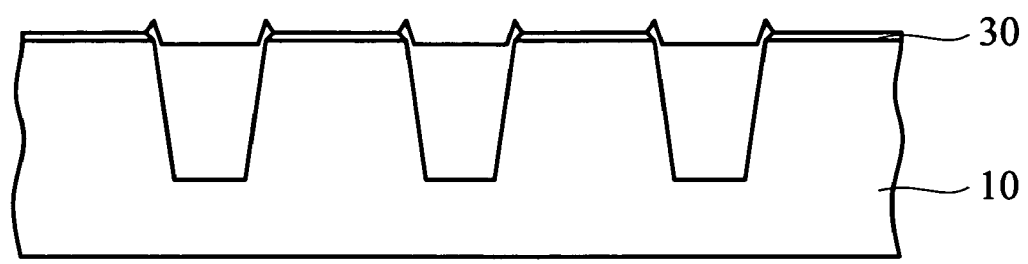
FIG. 17 is a cross sectional view of the structure of FIG. 16 showing the removal of portions of conductor layer following a floating gate polysilicon/conductor layer etching step according to one embodiment of the present invention.

FIG. 17 is a cross sectional view of the structure of FIG. 16 showing the removal of portions of conductor layer following a further floating gate polysilicon/conductor layer etching step according to one embodiment of the present invention.

In the preceding detailed description, the present invention is described with reference to specifically exemplary embodiments thereof. It will, however, be evident that various modifications, structures, processes, and changes may be made thereto without departing from the broader spirit and scope of the present invention, as set forth in the claims. The specification and drawings are, accordingly, to be regarded as illustrative and not restrictive. It is understood that the present invention is capable of using various other combinations and environments and is capable of changes or modifications within the scope of the inventive concept as expressed herein.

What is claimed is:

1. A method for forming a split-gate flash device, comprising:

providing a semiconductor substrate with a dielectric layer formed thereover;

forming a conductor layer overlying the dielectric layer;

depositing a masking layer overlying the conductor layer;

forming a light sensitive layer overlying the masking layer;

patterning and etching the light sensitive layer to form a pattern of openings therein;

etching the masking layer and the conductor layer according to the pattern of openings in the light sensitive layer;

etching the conductor layer at the outer surface area between the conductor layer and the dielectric layer to form undercuts;

etching the dielectric layer to form a notch profile at the outer surface area between the conductor layer and the dielectric layer and portions of the substrate to form a plurality of trenches;

filling an isolation layer over the plurality of trenches and the masking layer; and etching away the masking layer and portions of the isolation layer and the conductor layer, wherein a portion of the isolation layer is preserved in the notch profile.

2. The method of claim 1, her comprising removing the light sensitive layer.

3. The method of claim 1, further comprising removing portions of the etched away conductor layer.

4. The method of claim 1, wherein the dielectric layer comprises oxide.

5. The method of claim 1, wherein the conductor layer comprises polysilicon.

6. The method of claim 1, wherein the masking layer comprise silicon nitride.

7. The method of claim 1, further comprising removing the light sensitive layer.

8. A method for forming a memory device, comprising:
providing a semiconductor substrate with a dielectric layer formed thereover;
forming a conductor layer overlying the dielectric layer;
depositing a masking layer overlying the conductor layer;
forming a light sensitive layer overlying the masking layer;
patterning and etching the light sensitive layer to form a pattern of openings therein;
etching the masking layer and the conductor layer according to the pattern of openings in the light sensitive layer;
etching the conductor layer at the outer surface area between the conductor layer and the dielectric layer to form undercuts;
etching the dielectric layer to form a notch profile at the outer surface area between the conductor layer and the dielectric layer and portions of the substrate to form a plurality of trenches;
filling an isolation layer over the plurality of trenches and the masking layer; and
etching away the masking layer and portions of the isolation layer and the conductor layer, wherein a portion of the isolation layer is preserved in the notch profile.

9. The method of claim 8, further comprising removing the light sensitive layer.

10. The method of claim 8, further comprising removing portions of the etched away conductor layer.

11. The method of claim 8, wherein the dielectric layer comprises oxide.

12. The method of claim 8, wherein the conductor layer comprises polysilicon.

13. The method of claim 8, wherein the masking layer comprise silicon nitride.

14. The method of claim 8, further comprising removing the light sensitive layer.

* * * * *